(12) United States Patent
Calderon et al.

(10) Patent No.: US 9,459,325 B2
(45) Date of Patent: Oct. 4, 2016

(54) BATTERY CELL SCANNING SYSTEMS AND METHODS

(71) Applicant: GM GLOBAL TECHNOLOGY OPERATIONS LLC, Detroit, MI (US)

(72) Inventors: Edgar P. Calderon, Sterling Heights, MI (US); Gregory J. Rushlow, Richmond, MI (US); Hayley Hanchett, Flushing, MI (US); Jack Cravener, Portersville, PA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 243 days.

(21) Appl. No.: 14/099,640

(22) Filed: Dec. 6, 2013

(65) Prior Publication Data
US 2014/0239965 A1 Aug. 28, 2014

Related U.S. Application Data

(60) Provisional application No. 61/768,075, filed on Feb. 22, 2013.

(51) Int. Cl.
*G01N 27/416* (2006.01)
*G01R 31/36* (2006.01)

(52) U.S. Cl.
CPC ....... *G01R 31/3627* (2013.01); *G01R 31/3658* (2013.01)

(58) Field of Classification Search
USPC ......................................... 324/426, 433–434
See application file for complete search history.

(56) References Cited

U.S. PATENT DOCUMENTS

| | | | | |
|---|---|---|---|---|
| 4,207,391 A | * | 6/1980 | Church et al. | 429/229 |
| 5,451,881 A | * | 9/1995 | Finger | 324/433 |
| 5,963,008 A | * | 10/1999 | Cordeiro et al. | 320/100 |
| 2002/0075003 A1 | * | 6/2002 | Fridman et al. | 324/426 |

FOREIGN PATENT DOCUMENTS

| | | |
|---|---|---|
| CN | 102116844 A | 7/2011 |
| KR | 2005-0003923 | 3/2005 |
| WO | WO 2012-117448 | 9/2012 |

OTHER PUBLICATIONS

CN102116844A—Machine translation of application.
KR 2005-0003923—Machine translation of application.
WO 2012-117448—Machine translation of application.

* cited by examiner

*Primary Examiner* — Samuel Berhanu
(74) *Attorney, Agent, or Firm* — Phillips Ryther & Winchester; John P. Davis

(57) ABSTRACT

Systems and methods for scanning a battery cell to identify internal faults are disclosed. In certain embodiments, a method for scanning a battery cell for faults may comprise generating an input signal across first and second charge plates disposed on each side of the battery cell. An open circuit voltage of the battery cell generated in response to the input signal may be measured. The measured open circuit voltage may be compared with a reference signal associated with a reference battery cell having no faults. Based on the comparison, a fault and/or a possible fault within the battery cell being scanned may be identified.

14 Claims, 8 Drawing Sheets ental signals over time and an associated input sweep signal
BATTERY CELL SCANNING SYSTEMS AND METHODS

RELATED APPLICATIONS

This application claims the benefit of priority under 35 U.S.C. §119(e) to U.S. Provisional Patent Application No. 61/768,075, filed Feb. 22, 2013, and entitled "BATTERY CELL SCANNING SYSTEMS AND METHODS", which is hereby incorporated by reference in its entirety.

TECHNICAL FIELD

This disclosure relates to systems and methods for scanning a battery cell for faults. More specifically, but not exclusively, the systems and methods of the present disclosure relate to scanning a battery cell for faults caused by debris within the cell.

BACKGROUND

Passenger vehicles often include electric batteries for operating features of a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system (e.g., a 360V HV battery system) may be used to power electric drivetrain components of the vehicle (e.g., electric drive motors and the like). For example, an HV rechargeable energy storage system ("RESS") included in a vehicle may be used to power electric drivetrain components of the vehicle.

Battery cells within a battery system (e.g., an HV battery system) may develop certain faults. For example, faults may be inadvertently introduced in a battery system due to manufacturing errors. Faults in a battery cell may reduce battery system performance and/or damage a battery system. For example, debris in a cell included in a battery system may cause an isolation fault within the cell, thereby reducing performance of the battery system.

SUMMARY

Systems and methods are presented for scanning a battery cell for internal faults. In certain embodiments, a method for scanning a battery cell for faults may comprise generating an input signal (e.g., a swept frequency input signal) across first and second charge plates disposed on each side of the battery cell. An open circuit voltage of the battery cell generated in response to the input signal may be measured. The measured open circuit voltage may be compared with a reference signal associated with a reference battery cell having no faults. Based on the comparison, a fault and/or a possible fault within the battery cell being scanned may be identified.

In further embodiments a diagnostic system for scanning a battery cell for faults may comprise a function generator, a data acquisition system, and a control system communicatively coupled to the data acquisition system and the function generator. The function generator may be configured to generate an input signal across a first and a second charge plate disposed across a battery cell. The data acquisition system may be configured to measure an open circuit voltage of the battery cell. The control system may be configured to control the operation of the data acquisition system and the function generator and to compare the measured open circuit voltage with a reference signal, and identify whether the battery cell has a fault based on the comparison.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
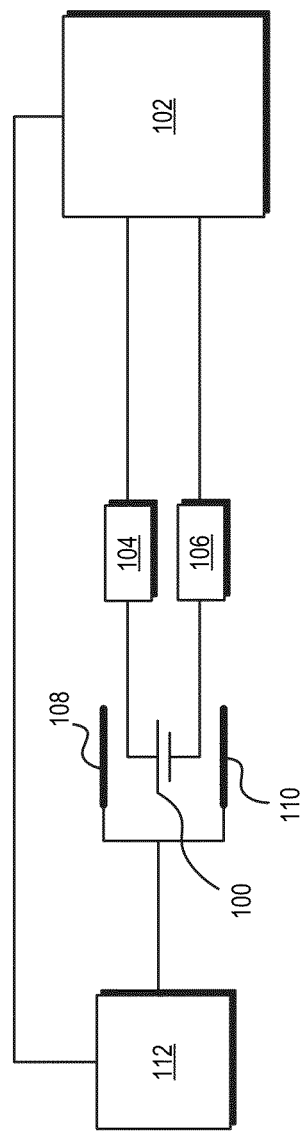
FIG. 1 illustrates an exemplary system for scanning a battery cell consistent with embodiments disclosed herein.

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

The systems and methods disclosed herein may allow for the detection and/or identification of faults (e.g., internal faults) in a battery cell. In certain embodiments, an open circuit voltage associated with ambient noise may be measured at a first cell terminal and a second cell terminal. In some embodiments, the open circuit voltage measurement may be made floating relative to earth and instrumentation ground. In certain embodiments, the reference battery cell may include no faults or, alternatively, may include certain faults that do not affect the performance of the battery cell. For example, the reference battery cell may include certain faults that do not affect the performance of the battery cell within particular thresholds. An ambient noise open circuit voltage frequency for a battery cell without faults or without significant faults (e.g., a reference profile frequency), denoted as f(amb), may be determined for the first and second terminals with the cell exposed to ambient noise.

Charge plates coupled to the output of a function generator may be placed on a first side and a second side of a battery cell undergoing fault testing or scanning. A frequency sweeping input signal may be provided to the conductive charge plates, and open circuit voltages associated with the input sweep signal may be measured across the battery cell. The open circuit voltages associated with the input sweep signal may be compared against f(amb). For example, open circuit voltages associated with the input sweep signal may be compared against f(amb) by taking the limit of $(X)_{initial \to final} = f(x) - f(amb)$, where $f(x)$ is the input sweep signal, $f(x)_{initial}$ is the initial frequency of the sweep signal, and $f(x)_{final}$ is the final frequency of the sweep signal. As the limit approaches f(amb) for f(x), in a battery cell without faults, the measured open circuit frequency and the ambient noise may sum to zero or near zero. If, however, there is a fault in the battery cell (e.g., an isolation fault caused by debris in the cell), such a fault may develop an associated frequency and the measured open circuit frequency and the ambient noise may not sum to zero or near zero. Based on this comparison, a fault and/or a possible fault within the battery cell may be identified.

FIG. 1 illustrates an exemplary system for scanning a battery cell 100 consistent with embodiments disclosed herein. In certain embodiments, the cell 100 may be a cell removed from an HV battery pack used to power electric drivetrain components of a vehicle (e.g., as in an electric and/or hybrid vehicle). In further embodiments, the cell 100 may be a cell included in a low voltage battery.

The battery cell 100 may include any number of sub-cells. Still further, the illustrated battery cell 100 may comprise a plurality of individual battery cells (e.g., a cell stack). As used herein, the term cell may refer to a single battery cell and/or any number of battery cells. The cell 100 may utilize any suitable battery technology or combination thereof. Suitable battery technologies may include, for example, lead-acid, nickel-metal hydride ("NiMH"), lithium-ion ("Li-Ion"), Li-Ion polymer, lithium-air, nickel-cadmium ("Ni-Cad"), valve-regulated lead-acid ("VRLA") including absorbed glass mat ("AGM"), nickel-zinc ("NiZn"), molten salt (e.g., a ZEBRA battery), and/or the like.

As illustrated, terminals of the cell 100 may be coupled to a data acquisition system 102. In some embodiments, the data acquisition system 102 may be included in a battery, vehicle, and/or diagnostic control system. The data acquisition system 102 may be configured to measure open circuit voltages of the terminals of the cell 100. In some embodiments, the data acquisition system 102 may be configured to perform differential measurements between two signals. In certain embodiments, the terminals of the cell 100 may be coupled to the data acquisition system 102 via one or more optical isolated voltage modules 104, 106. The optical isolated voltage modules 104, 106 may be configured to allow for electrically-isolated measurements of the open circuit voltages of the terminals of cell 100. It will be appreciated that the terminals of the cell 100 may be coupled to the data acquisition system 102 in a variety of ways, including using any suitable connection allowing for electrically-isolated measurement.

The data acquisition system 102 may be configured to measure an open circuit voltage at each cell terminal of a reference battery cell associated with ambient noise as discussed above. Based on this measurement, a reference profile frequency associated with ambient noise of the battery cell terminals (e.g., f(amb)) of the reference battery (e.g., a battery without faults or faults within certain thresholds) may be determined.

A first and a second charge plate 108, 110 (e.g., conductive charge plates) may be respectively disposed on a first side and a second side of the battery cell 100. The first and second charge plates 108, 110 may be coupled to a function generator 112. The function generator 112 may be further coupled to the data acquisition system 102 and be configured to provide certain signals to the data acquisition system 102 (e.g., input sweep signals and/or reference ambient noise signals). Although illustrated as separate systems, in further embodiments the data acquisition system 102 and the function generator 112 may be included in a single system or any combination of systems. In yet further embodiments, the data acquisition system 102 and/or the function generator 112 may be included in a battery, vehicle, and/or diagnostic control system. An input sweep signal may be provided to the charge plates 108, 110 by the function generator 112. Variations in the open circuit voltage associated with the input sweep signal may be measured across the battery cell 100 by the data acquisition system 102.

The data acquisition system 102 may provide a differential measurement between the open circuit voltages associated with the input sweep signal and a reference ambient noise open circuit voltage frequency (e.g., f(amb) provided by the function generator 112). For example, the data acquisition system 102 may be configured to calculate and/or provide a visual indication of the limit of $f(x)_{initial \to final} = f(x) - f(amb)$, where $f(x)$ is the input sweep signal, $f(x)_{initial}$ is the initial frequency of the sweep signal, and $f(x)_{final}$ is the final frequency of the sweep signal. As the limit approaches f(amb) for f(x), in a battery cell without faults (e.g., a reference battery cell or faults within certain thresholds), the measured open circuit frequency and the ambient noise may sum to zero or near zero. If, however, there is a fault in the battery cell (e.g., an isolation fault caused by debris in the cell), such a fault may exhibit an associated frequency, and accordingly, the measured open circuit frequency and the reference profile frequency associated with ambient noise may not sum to zero or near zero. Based on this comparison, a fault and/or a possible fault within the battery cell may be identified.

Figure 2:
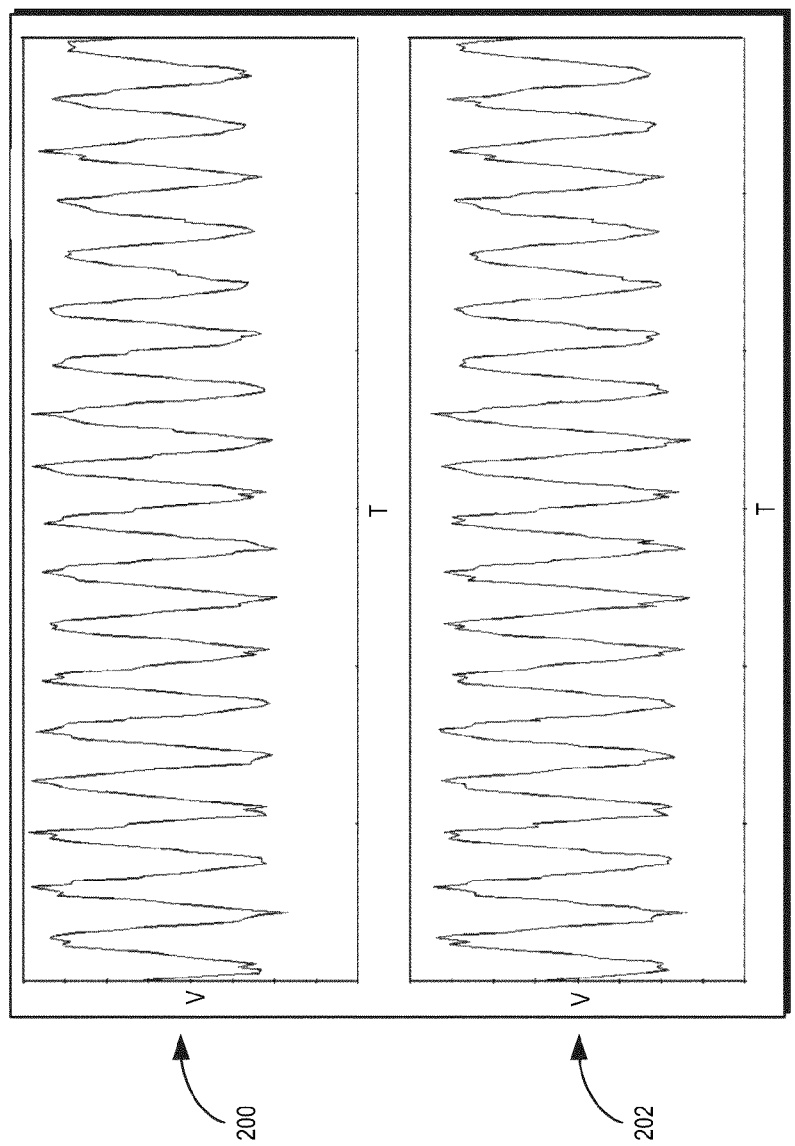
FIG. 2 illustrates graphs showing exemplary open circuit voltages over time associated with ambient noise consistent with embodiments disclosed herein.

FIG. 2 illustrates graphs showing exemplary open circuit voltages over time caused by ambient noise consistent with embodiments disclosed herein. As discussed above, a data acquisition system may be configured to measure an open circuit voltage at one or more cell terminals of a reference battery system associated with ambient noise as discussed above. Based on this measurement, a reference profile frequency associated with ambient noise of the battery cell terminals (e.g., f(amb)) may be determined. For example, an ambient noise open circuit voltage measured associated with a first terminal (e.g., a negative terminal) of a reference battery cell (e.g., graph 200), and an ambient noise open circuit voltage measured associated with a second terminal (e.g., a positive terminal) of a reference battery cell (e.g., graph 202) may be measured by a data acquisition system.

As illustrated, f(amb) may be, or may approximately be, a 60 Hz signal sinusoidal signal, although other reference profile frequencies are also possible.

Figure 3:
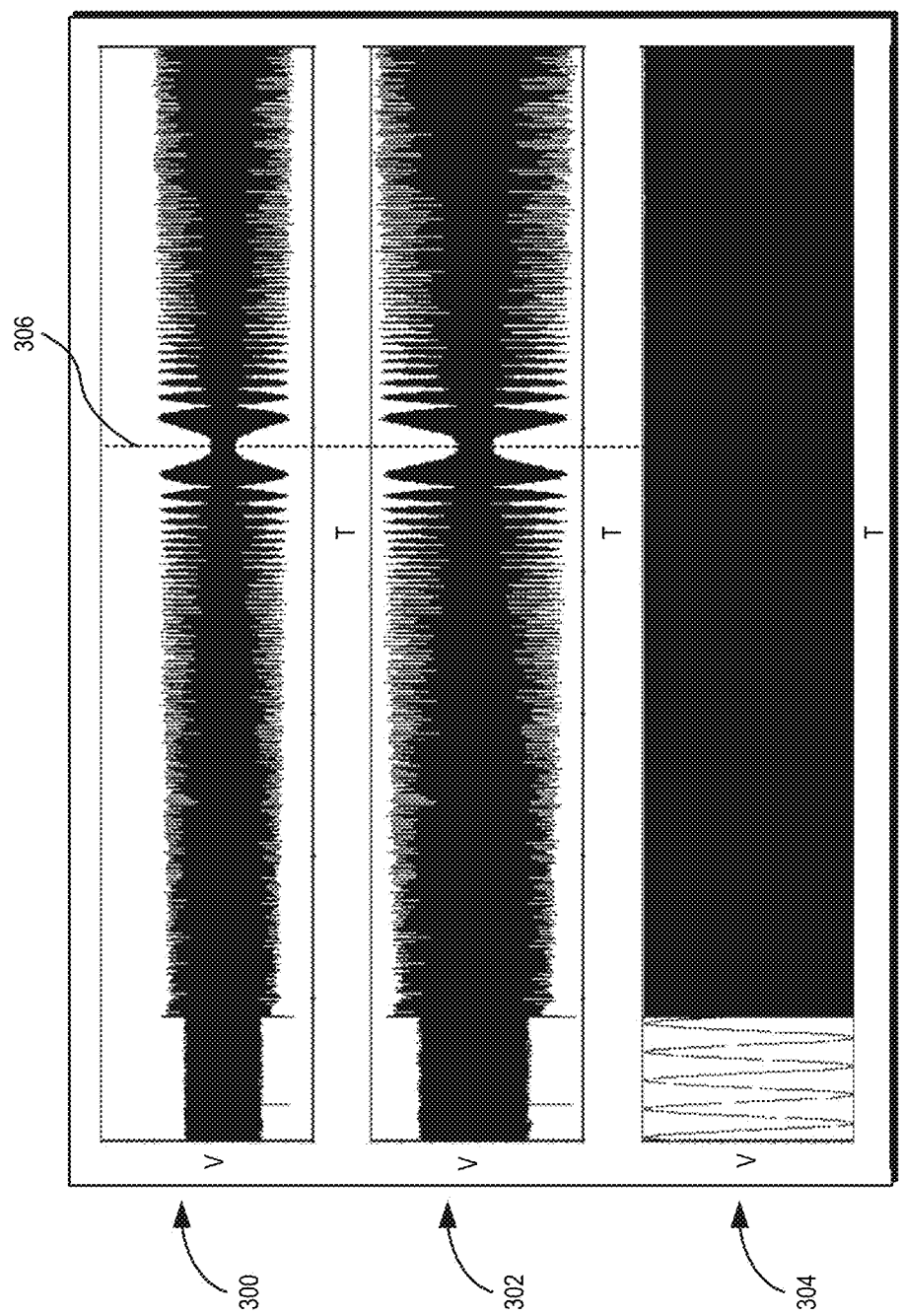
FIG. 3 illustrates graphs showing exemplary measurement signals over time and an associated input sweep signal consistent with embodiments disclosed herein.

FIG. 3 illustrates graphs showing exemplary voltage measurement signals 300, 302 over time and an associated input sweep signal 304 consistent with embodiments disclosed herein. Measurement signal 300 may be associated with a first terminal of a battery cell and measurement signal 302 may be associated with a second terminal of a battery cell. In certain embodiments, measurement signals 300, 302 may be differential voltage measurement signals against a reference profile frequency associated with ambient noise of a battery cell without faults (e.g., f(amb)).

Input sweep signal 304 may sweep from an initial frequency to a final frequency. In certain embodiments, before the input sweep signal 304 is introduced, a load may be applied across the cell terminals. For example, a 100 mA load and/or any other suitable load may be applied across the cell terminals for a certain period (e.g., 5 seconds). As illustrated, when the input sweep signal 304 reaches a frequency associated with the reference profile frequency associated with ambient noise of the battery cell without faults, at time 306, differential measurement signals 300, 302 may decrease. That is, measured open circuit voltage signals associated with the differential measurement signals 300, 302 together with the reference frequency associated with ambient noise of the battery cell without faults may sum to zero or near zero with the differential measurement. In other words, the reference profile frequency may exhibit complete or partial destructive interference with respect to the measured open circuit voltage signal in the differential measurement. Such measurement behavior may be used to determine that the battery cell associated with measurement signals 300, 302 is not exhibiting behavior associated with a fault.

Figure 4:
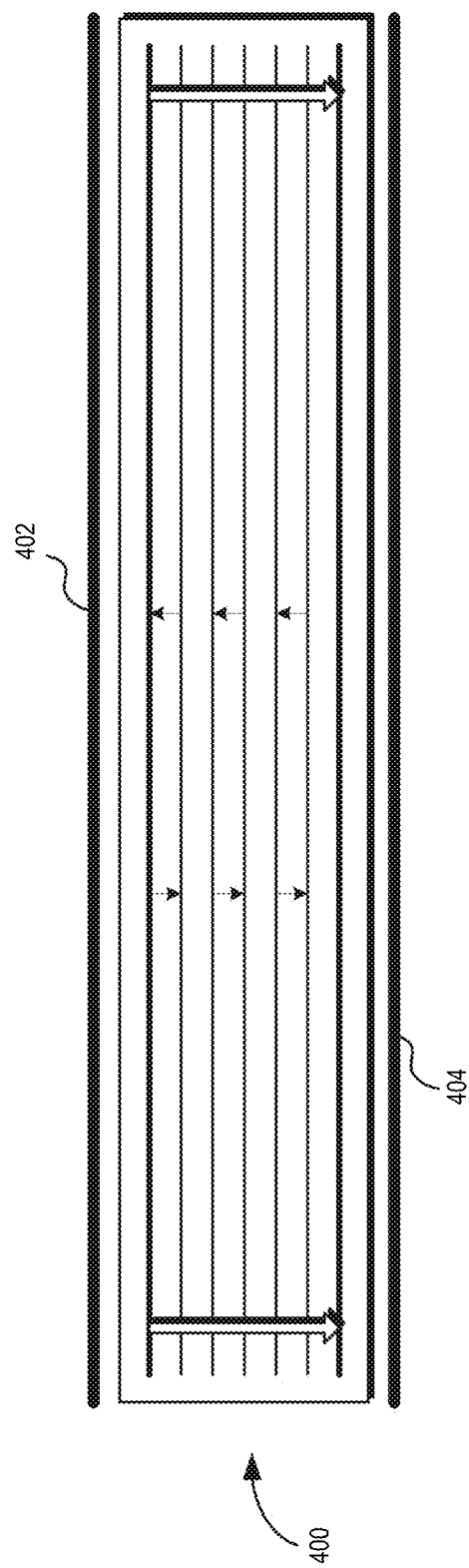
FIG. 4 illustrates exemplary charged particle flow in a battery cell consistent with embodiments disclosed herein.

FIG. 4 illustrates exemplary charged particle flow in a battery cell 400 consistent with embodiments disclosed herein. Particularly, the illustrated particle flow may reflect charged particle flow in a battery cell 400 while performing certain embodiments of the methods disclosed herein. As illustrated, when a signal (e.g., a DC signal) is driven into the cell 400 (e.g., by conductive charge plates 402, 404 or the like), positively charged particles may realign towards a negative charge plate and negatively charged particles may realign towards a positive charge plate.

Figure 5:
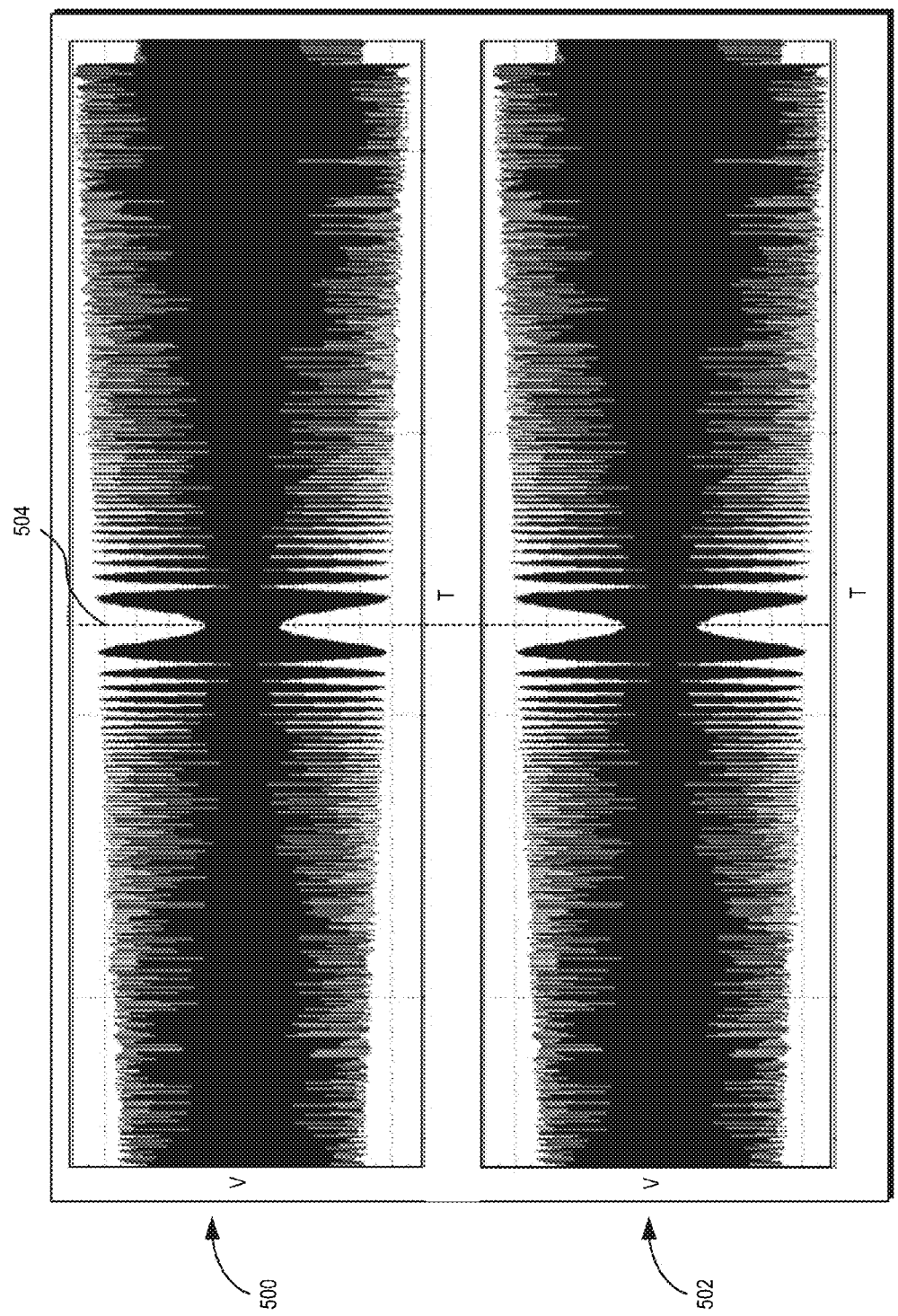
FIG. 5 illustrates graphs showing exemplary measurement signals over time of a cell that does not exhibit a fault consistent with embodiments disclosed herein.

FIG. 5 illustrates graphs showing exemplary measurement signals 500, 502 over time of a cell that does not exhibit a fault consistent with embodiments disclosed herein. Measurement signal 500 may be associated with a first terminal of a battery cell and measurement signal 502 may be associated with a second terminal of a battery cell. In certain embodiments, measurement signals 500, 502 may be differential measurement signals against a reference profile frequency associated with ambient noise of a battery cell without faults (e.g., f(amb)).

As illustrated, when an input sweep signal associated with measurement signals 500, 502 reaches a frequency associated with the reference profile frequency associated with ambient noise of the battery cell without faults, at time 504, measurement signals 500, 502 may decrease. That is, measured open circuit voltage signals associated with the differential measurement signals 500, 502 together with the reference profile frequency of the battery cell without faults may sum to zero or near zero with the differential measurement. In other words, the reference profile frequency may exhibit complete or partial destructive interference with respect to the measured open circuit voltage signal in the differential measurement. Such measurement behavior may be used to determine that the battery cell associated with measurement signals 500, 502 is not exhibiting behavior associated with a fault.

Figure 6:
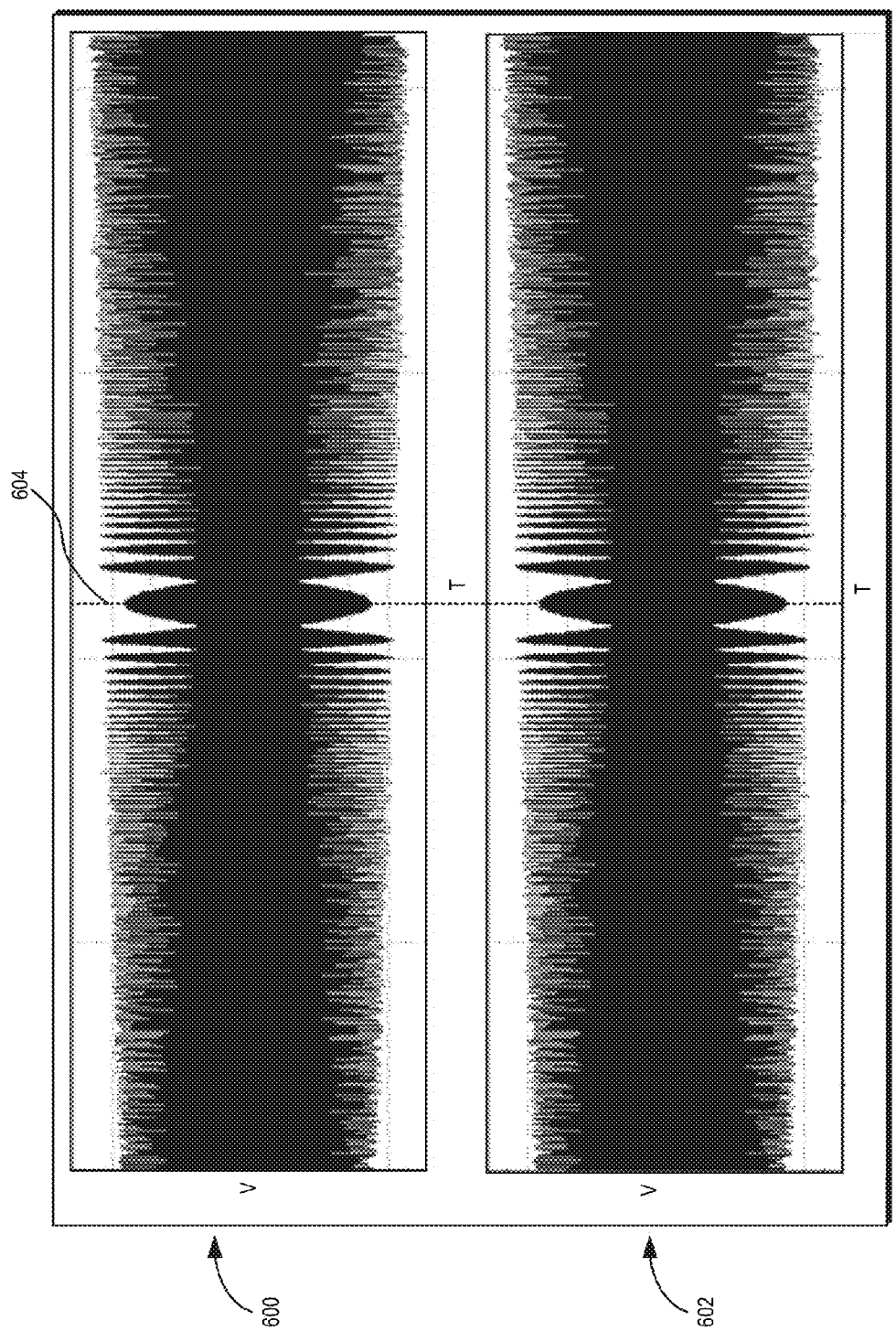
FIG. 6 illustrates graphs showing exemplary measurement signals over time of a cell that exhibits a fault consistent with embodiments disclosed herein.

FIG. 6 illustrates graphs showing exemplary measurement signals 600, 602 over time of a cell that exhibits a fault consistent with embodiments disclosed herein. Measurement signal 600 may be associated with a first terminal of a battery cell and measurement signal 602 may be associated with a second terminal of a battery cell. In certain embodiments, measurement signals 600, 602 may be differential measurement signals against a reference profile frequency associated with ambient noise of a reference battery cell without faults (e.g., f(amb)).

As illustrated, when an input sweep signal associated with measurement signals 600, 602 reaches a frequency associated with a reference profile frequency of the battery cell without faults, at time 604, measurement signals 600, 602 may not decrease. In comparing the results illustrated in FIGS. 3 and 5 with the results illustrated in FIG. 6, it may be noted that the measured open circuit voltage signals associated together with the reference profile frequency of the battery cell without faults do not sum to zero or near zero. In other words, the reference profile frequency may not exhibit complete or partial destructive interference with respect to the measured open circuit voltage signal. The absence of destructive interference may indicate that the cell has or likely has a fault.

As discussed above, a fault in a cell may be caused by the presence of a foreign object (e.g., debris) in a cell and may be associated with a particular frequency response. Accordingly, in a differential measurement, a measured open circuit voltage signal of a cell may not sum to zero or near zero with the differential measurement by a reference profile frequency of the battery cell without faults. Rather, the differential measurement signals 600, 602, may exhibit a peak at the ambient noise frequency (e.g., a peak at time 604), thereby indicating that the cell has or likely has a fault. In other words, in a cell having a fault, the reference profile may exhibit constructive interference with respect to the measured open circuit voltage signal.

Figure 7:
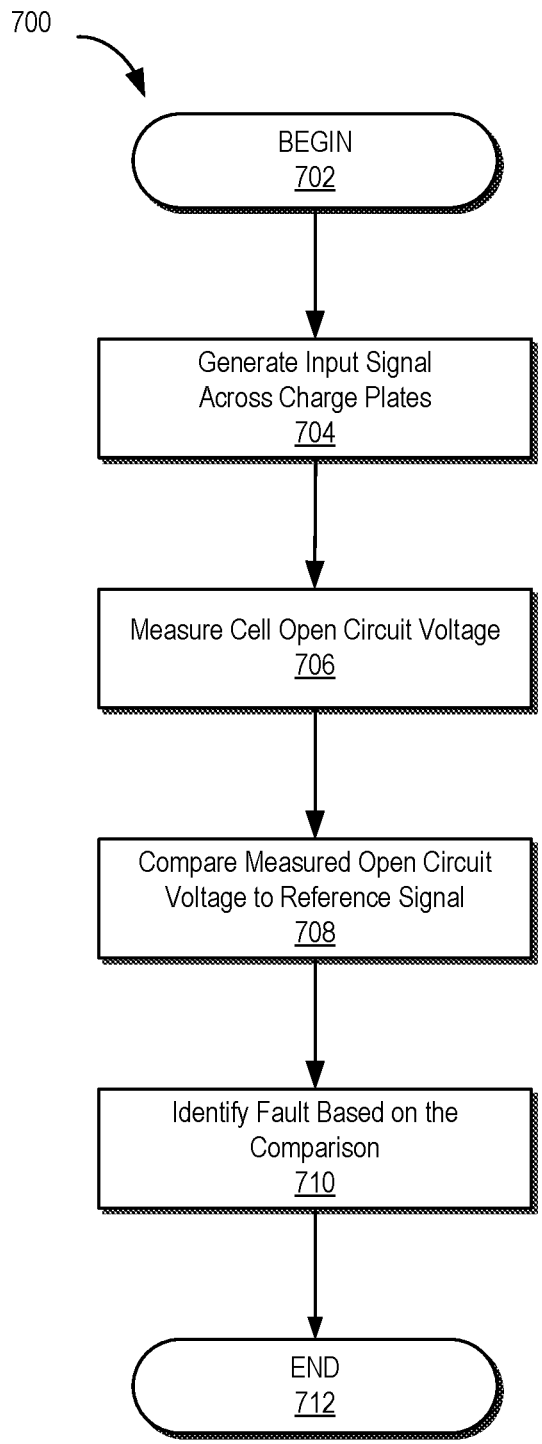
FIG. 7 illustrates a flow chart of an exemplary method for identifying a fault in a battery cell consistent with embodiments disclosed herein.

FIG. 7 illustrates a flow chart of an exemplary method 700 for identifying a fault in a battery cell consistent with embodiments disclosed herein. In certain embodiments, the method 700 may be utilized in identifying a fault in a battery cell caused by debris within the cell, although other types of faults may also be identified using the systems and methods disclosed herein. At 702, the method may initiate. At 704, an input signal may be generated across a first and a second charge plate across a battery cell. In some embodiments, the input signal may comprise a swept frequency input signal.

An open circuit voltage of the battery cell generated in response to the input signal may be measured at 706. At 708, the open circuit voltage measured at 706 may be compared with a reference signal associated with a reference battery cell having no faults. In certain embodiments, the reference signal may comprise a signal associated with an ambient noise open circuit voltage frequency for a battery cell without faults or without significant faults. Based on the comparison at 708, a fault in the battery cell may be identified at 710. In certain embodiments, a fault in the battery cell may be identified based on a differential measurement between the measured open circuit voltage measured at 706 and the reference signal associated with ambient noise of a reference battery without faults. For example, when the reference signal does not exhibit complete or partial destructive interference with respect to the measured open circuit voltage at a frequency of the reference signal, a fault within the battery cell may be identified. The method may proceed to terminate at 712.

Figure 8:
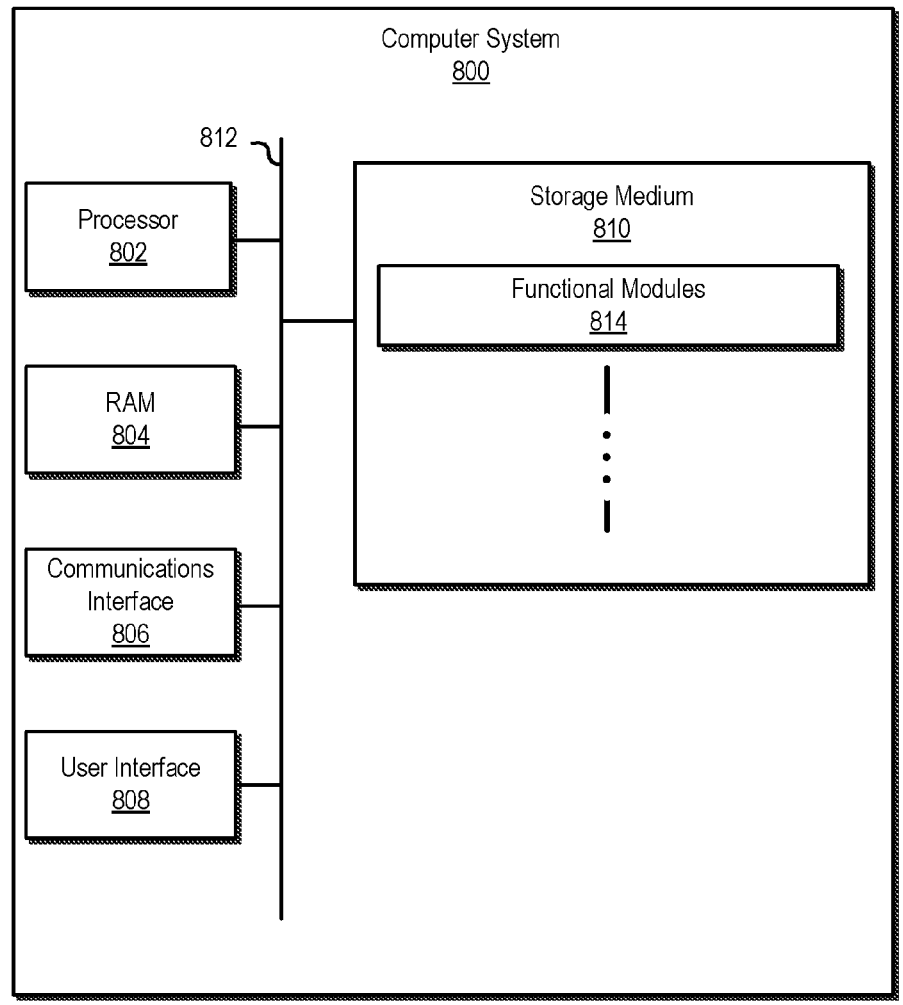
FIG. 8 illustrates an exemplary system for implementing certain embodiments of the systems and methods disclosed herein.

FIG. 8 illustrates an exemplary system 800 for implementing certain embodiments of the systems and methods disclosed herein. In certain embodiments, the computer system 800 may be a personal computer system, a server computer system, a vehicle control system, a battery control system, a diagnostic control system, and/or any other type of system or combination of systems suitable for implementing the disclosed systems and methods. For example, in some embodiments, the computer system 800 may be utilized in connection with implementing functionality of a data acquisition system and/or a function generator as described above.

As illustrated, the computer system 800 may include, among other things, one or more processors 802, random access memory ("RAM") 804, a communications interface 806, a user interface 808, and a non-transitory computer-readable storage medium 810. The processor 802, RAM 804, communications interface 806, user interface 808, and computer-readable storage medium 810 may be communicatively coupled to each other via a common data bus 812. In some embodiments, the various components of the computer system 800 may be implemented using hardware, software, firmware, and/or any combination thereof.

User interface 808 may include any number of devices allowing a user to interact with the computer system 800. For example, user interface 808 may be used to display an interactive interface to a user. The user interface 808 may be a separate interface system communicatively coupled with the computer system 800 or, alternatively, may be an integrated system such as a display interface for a laptop or other similar device. In certain embodiments, the user interface 808 may be produced on a touch screen display. The user interface 808 may also include any number of other input devices including, for example, keyboard, trackball, and/or pointer devices.

The communications interface 806 may be any interface capable of communicating with other computer systems, peripheral devices, and/or other equipment communicatively coupled to computer system 800. For example, the communications interface 806 may allow the computer system 800 to communicate with other computer systems (e.g., computer systems associated with external databases and/or the Internet), allowing for the transfer as well as reception of data from such systems. The communications interface 806 may include, among other things, a modem, a satellite data transmission system, an Ethernet card, and/or any other suitable device that enables the computer system 800 to connect to databases and networks, such as LANs, MANs, WANs and the Internet. In certain embodiments, the communications interface 806 may be configured to interface with one or more charge plates used in connection with the disclosed embodiments.

Processor 802 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 802 may be configured to execute computer-readable instructions stored on non-transitory computer-readable storage medium 810. Computer-readable storage medium 810 may store other data or information as desired. In some embodiments, the computer-readable instructions may include computer executable functional modules 814. For example, the computer-readable instructions may include one or more functional modules 814 configured to implement all or part of the functionality of the systems and methods described above. Specific functional models that may be stored on computer-readable storage medium 810 may include a module configured to perform data acquisition methods (e.g., measurements of open circuit voltages and/or the like) and/or a module configured to perform function generation methods (e.g., introducing input signals to a battery cell via one or more connected charge plates or the like).

The system and methods described herein may be implemented independent of the programming language used to create the computer-readable instructions and/or any operating system operating on the computer system 800. For example, the computer-readable instructions may be written in any suitable programming language, examples of which include, but are not limited to, C, C++, Visual C++, and/or Visual Basic, Java, Perl, or any other suitable programming language. Further, the computer-readable instructions and/or functional modules may be in the form of a collection of separate programs or modules, and/or a program module within a larger program or a portion of a program module. The processing of data by computer system 800 may be in response to user commands, results of previous processing, or a request made by another processing machine. It will be appreciated that computer system 800 may utilize any suitable operating system including, for example, Unix, DOS, Android, Symbian, Windows, iOS, OSX, Linux, and/or the like.

Although the foregoing has been described in some detail for purposes of clarity, it will be apparent that certain changes and modifications may be made without departing from the principles thereof. It is noted that there are many alternative ways of implementing both the processes and systems described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method for identifying a fault in a battery cell, the method comprising:
   generating an input signal across a first and a second charge plate, the first charge plate being disposed on a first side of the battery cell and the second charge plate being disposed on a second side of the battery cell, the input signal comprising a swept frequency input signal;
   measuring an open circuit voltage of the battery cell;
   comparing the measured open circuit voltage with a reference signal, wherein the comparing further comprises:
     generating a differential measurement signal based on the measured open circuit voltage and the reference signal, and
     determining whether the differential measurement signal exhibits destructive interference at a frequency associated with the reference signal; and
   identifying whether the battery cell has a fault based on the determination.

2. The method of claim 1, wherein the reference signal comprises an open circuit voltage signal associated with a reference battery cell.

3. The method of claim 2, wherein the open circuit voltage signal associated with the reference battery cell comprises an open circuit voltage signal measured from the reference battery cell without faults exposed to ambient noise.

4. The method of claim 1, wherein determining whether the differential measurement signal exhibits destructive interference comprises determining that the differential measurement signal exhibits destructive interference at the frequency associated with the reference signal, and identifying whether the battery cell has a fault comprises identifying that the battery cell does not have a fault based on the determination.

5. The method of claim 1, wherein determining whether the differential measurement signal exhibits destructive interference comprises determining that the differential measurement signal does not exhibit destructive interference at the frequency associated with the reference signal, and identifying whether the battery cell has a fault based comprises identifying that the battery cell has a fault based on the determination.

6. The method of claim 1, wherein identifying whether the battery cell has a fault comprises identifying whether the battery cell has debris within the battery cell.

7. The method of claim 1, wherein the method further comprises:
   applying a load across terminals of the battery cell before generating the input signal.

8. A battery cell diagnostic system comprising:
   a function generator configured to generate an input signal comprising a swept frequency input signal across a first and a second charge plate, the first charge plate being disposed on a first side of a battery cell and the second charge plate being disposed on a second side of the battery cell;
   a data acquisition system configured to measure an open circuit voltage of the battery cell; and
   a control system communicatively coupled to the data acquisition system and the function generator configured to control the operation of the data acquisition system and the function generator and to:
     compare the measured open circuit voltage with a reference signal, wherein the comparing further comprises:
       generating a differential measurement signal based on the measured open circuit voltage and the reference signal,
       determining whether the differential measurement signal exhibits destructive interference at a frequency associated with the reference signal, and
     identify whether the battery cell has a fault based on the comparison.

9. The battery cell diagnostic system of claim 8, wherein the reference signal comprises an open circuit voltage signal associated with a reference battery cell.

10. The battery cell diagnostic system of claim 9, wherein the open circuit voltage signal associated with the reference battery cell comprises an open circuit voltage signal measured from the reference battery cell without faults exposed to ambient noise.

11. The battery cell diagnostic system of claim 8, wherein determining whether the differential measurement signal exhibits destructive interference comprises determining that the differential measurement signal exhibits destructive interference at the frequency associated with the reference signal, and identifying whether the battery cell has a fault comprises identifying that the battery cell does not have a fault based on the determination.

12. The battery cell diagnostic system of claim 8, wherein determining whether the differential measurement signal exhibits destructive interference comprises determining that the differential measurement signal does not exhibit destructive interference at the frequency associated with the reference signal, and identifying whether the battery cell has a fault comprises identifying that the battery cell has a fault based on the determination.

13. The battery cell diagnostic system of claim 8, wherein identifying whether the battery cell has a fault comprises identifying whether the battery cell has debris within the battery cell.

14. The battery cell diagnostic system of claim 8, wherein the control system is further configured to apply a load across terminals of the battery cell before generating the input signal.

* * * * *